United States Patent [19]

Zommer

[11] Patent Number: 5,698,454
[45] Date of Patent: Dec. 16, 1997

[54] METHOD OF MAKING A REVERSE BLOCKING IGBT

[75] Inventor: Nathan Zommer, Los Altos, Calif.

[73] Assignee: IXYS Corporation, Santa Clara, Calif.

[21] Appl. No.: 508,753

[22] Filed: Jul. 31, 1995

[51] Int. Cl.[6] .................... H01L 21/265; H01L 45/00
[52] U.S. Cl. ..................................... 437/6; 437/31
[58] Field of Search ......................... 437/6, 31, 40 DM, 437/41 DM, 41 RBP, 74, 75, 76, 77, 78, 79

[56] References Cited

U.S. PATENT DOCUMENTS

| | | | |
|---|---|---|---|
| 3,574,009 | 4/1971 | Chizinsky et al. | 437/6 |
| 4,042,448 | 8/1977 | Chang | 437/75 |
| 4,066,483 | 1/1978 | D'Altroy et al. | 437/6 |
| 4,351,677 | 9/1982 | Mochizuki et al. | 257/129 |
| 4,450,467 | 5/1984 | Nagano et al. | 437/6 |
| 4,717,940 | 1/1988 | Shinohe et al. | 357/38 |
| 4,720,469 | 1/1988 | Keser et al. | 437/143 |
| 4,914,496 | 4/1990 | Nakagawa et al. | 357/38 |
| 4,967,255 | 10/1990 | Bauer et al. | 357/37 |
| 4,994,885 | 2/1991 | Yoshizawa | 357/39 |
| 5,077,224 | 12/1991 | Schwarzbauer et al. | 437/6 |
| 5,084,401 | 1/1992 | Hagino | 437/41 RBP |
| 5,105,244 | 4/1992 | Bauer | 357/23.4 |
| 5,119,153 | 6/1992 | Korman et al. | 357/23.4 |
| 5,155,569 | 10/1992 | Terashima | 357/38 |
| 5,164,802 | 11/1992 | Jones et al. | 257/337 |
| 5,202,750 | 4/1993 | Gough | 257/133 |
| 5,248,622 | 9/1993 | Matsuda et al. | 437/6 |
| 5,286,655 | 2/1994 | Tsunoda | 437/6 |
| 5,298,457 | 3/1994 | Einthoven et al. | 437/131 |
| 5,360,746 | 11/1994 | Terashima | 437/6 |
| 5,372,954 | 12/1994 | Terashima | 437/31 |
| 5,440,164 | 8/1995 | Finney et al. | 257/378 |

FOREIGN PATENT DOCUMENTS

| | | |
|---|---|---|
| 0312088A2 | 4/1989 | European Pat. Off. . |
| 0361316A2 | 4/1990 | European Pat. Off. . |

OTHER PUBLICATIONS

Temple, "MOS–Controlled Thyristors—A New Class of Power Devices," *IEEE Trans. Elec. Dev.*, (1989) vol. ED–33, pp. 1609–1618.

Temple, "Power Device Evolution and the MOS–Controlled Thyristor," *PCIM* (Nov. 1987), pp. 23–29.

Wolf, S. and Tauber, R. N., "Silicon Processing for the VLSI ERA," vol. 1, p. 28, (1986), Latice Press.

*Primary Examiner*—Brian Dutton
*Attorney, Agent, or Firm*—Townsend and Townsend and Crew LLP

[57] ABSTRACT

A method of forming a power integrated circuit device (100) including a semiconductor layer of first conductivity type. The semiconductor layer includes a front-side surface (103), a backside surface (116), and a scribe region (117). The semiconductor layer further including a plurality of active cells on the front-side surface (103). The present method includes forming a backside layer (116) of second conductivity type overlying the backside surface, and forming a continuous diffusion region (117) of the second conductivity type through the semiconductor layer to connect the scribe region to the backside layer (116).

25 Claims, 4 Drawing Sheets

5,698,454

1

METHOD OF MAKING A REVERSE BLOCKING IGBT

BACKGROUND OF THE INVENTION

The present invention relates to integrated circuit devices, and in particular high voltage semiconductor switching devices such as high voltage transistors, power MOSFETs, IGBTs, thyristors, MCTs, and the like (hereinafter called power devices). Merely by way of example, the present invention is illustrated with an insulated gate bipolar transistor (IGBT) fabrication method and structure.

High voltage transistors such as conventional insulated gate bipolar transistors and the like, hereinafter referred to as conventional IBGTs, are fabricated by conventional semiconductor processing techniques on a single crystalline semiconductor substrate such as a silicon wafer. Conventional semiconductor processing techniques include doping and implanting, lithography, diffusion, chemical vapor deposition (CVD), wet and dry etching, sputtering, epitaxy, and oxidizing. A complex sequence of these processing techniques is often required to produce the conventional IBGT having a high breakdown voltage.

FIG. 1 illustrates a circuit diagram for the conventional IGBT 10. The conventional IGBT includes a gate terminal (G) 11, a drain terminal (D) 13, and a source terminal (S) 15. As shown, a positive voltage potential exists between the drain terminal 13 and the source terminal 15. No switching voltage exists at the gate terminal when the device is in an off-state, and no electrical current passes from the drain terminal 13 to the source terminal 15 in the off-state. The conventional IGBT turns "on" to an on-state when a switching voltage is applied to the gate terminal 11. Current passes from the drain terminal 13 to the source terminal 15 in the on-state.

The conventional IGBT includes a voltage blocking rating only in one direction. In particular, the conventional IGBT provides a "forward blocking" mode to block electrical current therethrough. In the forward 5 blocking mode, the gate is in an off-state, high voltage appears on the drain terminal 13, and low voltage appears on the source terminal 15. Substantially no electrical current flows through the conventional IGBT in the forward blocking mode. It should be noted the forward blocking mode corresponds to the same biasing conditions on the drain terminal and the source terminal as the forward conduction mode, when the device is turned-on.

A limitation with the conventional IGBT 20 is device break down often occurs when relatively low voltage is applied to the device in a reverse blocking mode configuration as illustrated by FIG. 2. In the reverse blocking mode, a positive voltage potential is applied to the source terminal relative to the drain terminal, and the gate terminal is in an off-state. The relatively low voltage such as 30–50 volts applied to the source terminal 15, relative to the drain terminal 13, causes uncontrolled conduction of electrical current through the device even though the gate is in the off-state as illustrated by FIG. 3.

FIG. 3 illustrates IDS (current drain to source) as a function of $V_{DS}$ (voltage drain to source) for a conventional IGBT device having a breakdown voltage at about 1,800 volts. The conventional IGBT device breaks down causing an uncontrolled conduction of current through the device at about 1,800 volts in the forward blocking mode. At about –35 volts in the reverse blocking mode, uncontrolled conduction of electrical current occurs through the conventional

2

IGBT device. The uncontrolled conduction of electrical current limits the application of the conventional IGBT to direct current configurations operating in the forward conduction mode.

It is often desirable to use an IGBT for alternating current (AC) applications. Conventional AC applications require the conventional IGBT to be subject to both positive and negative voltage potentials at source and drain terminals. However, the conventional IGBT simply cannot effectively block the negative voltage potential because of its limited reverse blocking rating. Accordingly, the conventional IGBT is limited to DC switch applications.

From the above, it is seen that a method and structure for providing a semiconductor device with a high breakdown voltage in both the forward and reverse conduction mode that is easy to manufacture, reliable, and cost effective is often desired.

SUMMARY OF THE INVENTION

According to the present invention, a high voltage IBGT integrated circuit device with high ratings for both forward and reverse biasing modes is provided. The present high voltage IGBT is often easy to fabricate includes a series of diffusions which are often easy to fabricate by way of conventional semiconductor fabrication techniques.

In a specific embodiment, the present invention provides a fabrication method for an integrated circuit, including a semiconductor layer of a first conductivity type. The semiconductor layer includes a front-side surface, a backside surface, and a scribe region. The semiconductor layer also includes a plurality of active cells on the front-side surface. The present method includes forming a backside layer of second conductivity type overlying the backside surface. The present method further includes forming a continuous diffusion region of the second conductivity type through the semiconductor layer to connect the scribe region to the backside layer.

In an alternative specific embodiment, the present invention provides a power integrated circuit device. The present power integrated circuit device includes a semiconductor layer of first conductivity type, where the semiconductor layer includes a front-side surface, a backside surface, and a scribe region. The semiconductor layer further includes a plurality of active cells on the front-side surface, and a backside layer of second conductivity type overlying the backside surface. A continuous diffusion region of the second conductivity type through the semiconductor layer to connect the scribe region to the backside layer is also included.

A further alternative embodiment includes a high voltage bipolar transistor switch. The present high voltage switch includes a high voltage alternating current power source including a first high voltage node and a second high voltage node. The present high voltage switch also includes a first bipolar transistor having a first source terminal, a first drain terminal, and a first gate terminal, and a second bipolar transistor having a second source terminal, a second drain terminal, and a second gate terminal. The second source is coupled to the first drain terminal at a first node, and the second drain terminal is coupled to the first source terminal at a second node. The second node is coupled to the second high voltage node. A load including a first load node and a second load node is also included. The first load node is coupled to the first node, and the second load node is coupled to the first high voltage node. Each of the first and second bipolar transistors further includes a semiconductor layer of first conductivity type, where semiconductor layer has a front-side surface, a backside surface, and a scribe region. The semiconductor layer further includes a plurality of active cells on the front-side surface. Each first and second bipolar transistor also includes a backside layer of second conductivity type overlying the backside surface. A continuous diffusion region of the second conductivity type through the semiconductor layer to connect the scribe region to the backside layer is also included.

A further understanding of the nature and advantages of the present invention may be realized by reference to the latter portions of the specification and attached drawings.

DESCRIPTION OF THE SPECIFIC EMBODIMENT

Conventional IGBT Structures

Figure 1:
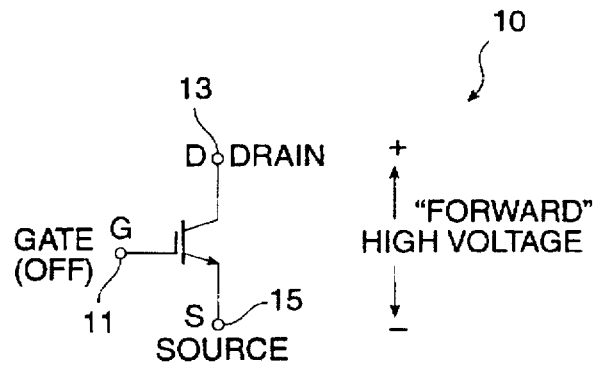
FIGS. 1–2 are circuit diagrams of a conventional IGBT device.
Figure 2:
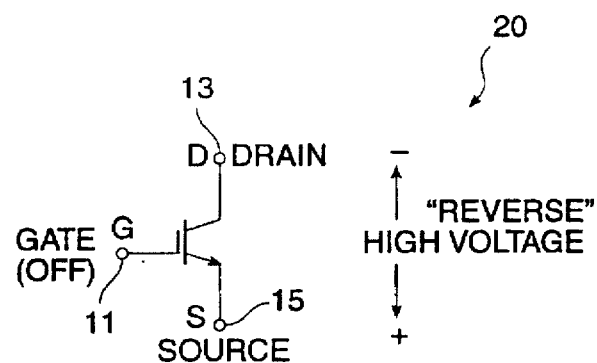
Figure 3:
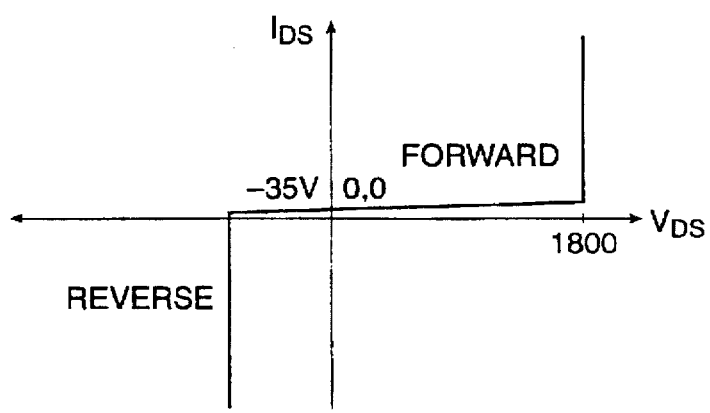
FIG. 3 is an illustration of breakdown voltage for a conventional IGBT device.
Figure 4:
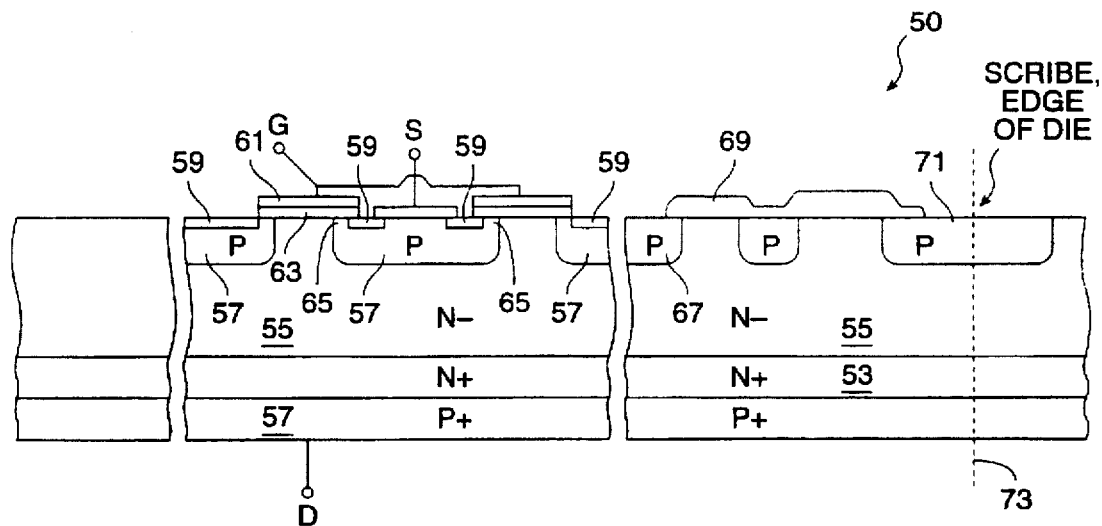
FIG. 4 is a simplified cross-sectional view of a conventional IGBT device.

FIG. 4 is a simplified cross-sectional view 50 of a conventional IGBT integrated circuit device. The conventional IGBT device is often fabricated by a double diffused MOS process (DMOS). The conventional IGBT device 50 includes an N+ type substrate 53, an overlying N− type layer 55, and an underlying P+ type layer 57. P/P+ type well regions 57 are defined in the N− type layer 55. Each P/P+ type well region 57 includes an N type source 59 region defined within its perimeter. A gate polysilicon layer 61 is defined overlying a gate oxide layer 63 overlying a portion of the P/P+ type well region 57. A channel region 65 is defined in a portion of the P type well region between the N type source and a portion of the N− type layer. A gate (G), a source (S), and a drain (D) define the conventional IGBT device structure.

The conventional IGBT device also includes a plurality of P type guard ring regions 67 defined in the N− type layer 55. A field plate 69 typically made of polysilicon is defined overlying the guard ring regions 67. The conventional IGBT device further includes a P type scribe region 71 also defined in the N− type layer 55. The scribe region defines an outer edge of the integrated circuit chip after being removed from the wafer.

The conventional IGBT device of FIG. 4 forms an active region of a typical chip. An active area may comprise hundreds, thousands, or even millions of these microscopically small regions, each defining an active IBGT device. These devices may comprise cells which are all connected in parallel. Alternatively, these regions may comprise stripes or the like defining the active device. These structures of the active device, whether cells or strips, do not typically affect its high voltage characteristics.

Depending upon whether the conventional IGBT device shown in FIG. 4 operates as an IGBT (or thyristor) depends upon the resistance levels of the layers. For thyristor operation, latch-up is promoted by decreasing the doping in the P/P+ well regions while heavily doping the substrate. This also increases the gain through the device. Conventional IGBT operation, however, requires low resistivity through the N− type layer which does not promote latch-up. Thus, the dopant levels within each layer must be adjusted accordingly to provide IGBT (or thyristor) operation.

The conventional IGBT device provides for off-state voltage blocking to occur predominately in one direction. The conventional IGBT device includes a high forward blocking rating, but a low reverse blocking rating, thereby being limited to DC applications. The low reverse blocking rating occurs by way of the N+/P+ junction 73 which is exposed upon die separation. The exposed N+/P+ junction includes certain doping characteristics which cannot provide for a high breakdown voltage in the reverse conductive mode. For example, high voltage applied to the source terminal relative to the drain terminal creates a main P/P+ type well that is forward biased relative to the N− type layer, creating a diode P/N. The diode P/N is electrically in series with the N+/P+ junction, typically acting like a leaky "zener diode" by way of the unpassivated N+/P+ junction surfaces. The forward biased diode P/N in series with the unpassivated N+/P+ junction cause a low breakdown voltage through the device when the source terminal is high relative to the drain terminal, thereby creating a low reverse blocking rating. The low reverse blocking rating is often incompatible for use with AC applications and the like.

Present IGBT Structures

Figure 5:
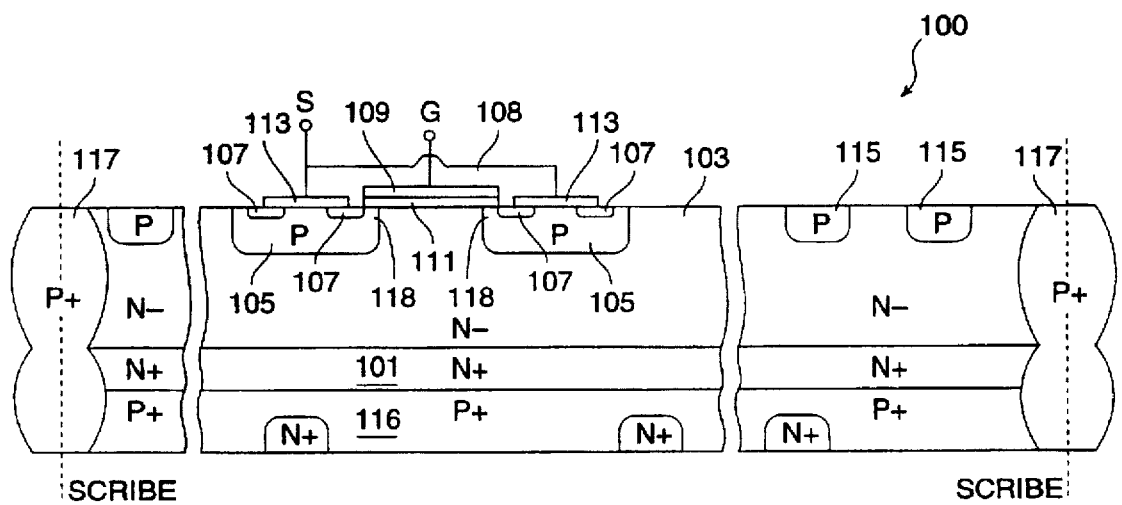
FIG. 5 is a simplified cross-sectional view of an IGBT device according to the present invention.

FIG. 5 is a simplified cross-sectional view of an IGBT integrated circuit device 100 according to the present invention. The present IBGT device may be formed by a double diffused MOS process (DMOS) and the like. Other fabrication techniques may also be used depending upon the particular application. The present IGBT device 100 includes an N+ type semiconductor substrate 101. An N− type layer 103 is formed overlying the N+ type semiconductor substrate 101. The N− type layer 103 is often an epitaxial layer or the like. P/P+ type well regions 105 define onto the N− type layer 103. The present IGBT device also includes a plurality of N type source regions 107 defined into a perimeter of each P/P+ type well region 105. The present IGBT device includes a gate polysilicon layer (G) 109 defined overlying a thin layer of gate oxide 111 and the like. Source metallization 113 is defined overlying the N type source regions 107, and connects 108 each source region together. A P type diffusion region 116 is defined overlying the backside of the N+ type substrate. The P type diffusion region is a P+ type drain region. A channel region 118 is defined in a portion of the P/P+ type well region between the source region 107 and a portion of the N− type layer 103.

The present IGBT device also includes a plurality of guard ring structures 115. The guard ring structures are each P type diffusions, typically surrounding the periphery of the integrated circuit chip active cell region. A field plate (not shown) made of polysilicon is often defined overlying the guard ring structures. The guard ring structure tends to keep the main conduction region toward the active cell region of the integrated circuit chip, thereby preserving the voltage rating of the device.

A P type region 117 defines the scribe line of the present IGBT device. The P type region creates a "wrap around" P type envelope covering sides of the die including the bottom P+ type drain region. The P type region eliminates the exposed P+/N+ junction of the convention IGBT device of FIG. 4. Thus, the present IGBT device promotes breakdown to occur at the P+/N junction interface, thereby preserving the high breakdown voltage of the device in both reverse and forward blocking modes.

Figure 6:
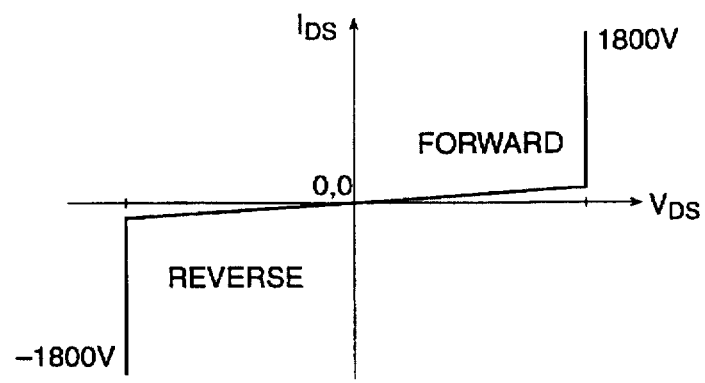
FIG. 6 is a simplified illustration of breakdown voltage for the IGBT device of FIG. 5 according to the present invention.

FIGS. 6 is a simplified illustration of breakdown voltage of the IGBT device of FIG. 4 according to the present invention. The present IGBT shows current IDS (current drain to source) as a function of voltage $V_{DS}$ (voltage drain to source) for a 1,800 volt device. The present IGBT device passes substantially no electrical current through the device until the voltage between the source and drain reaches the breakdown voltage of about 1,800 volts and greater or −1,800 volts and less. At the breakdown voltage, the present IGBT device passes electrical current via breakdown. Substantially no electrical current passes through the present IGBT device until breakdown occurs or the proper switching voltage is applied to the gate terminal of the device. Accordingly, the present IGBT device includes a high forward blocking rating and a high reverse blocking rating.

Figure 7:
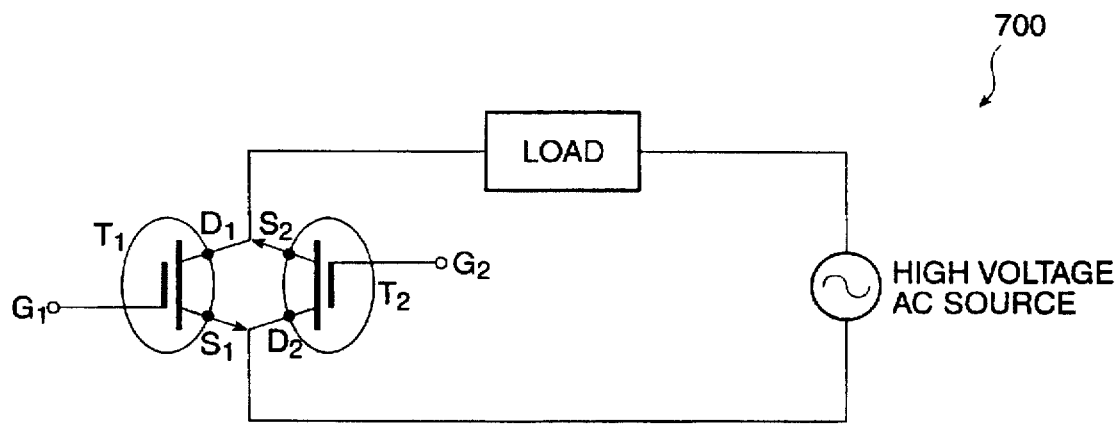
FIG. 7 is a simplified circuit diagram of an IGBT according to the present invention.
Figure 8:
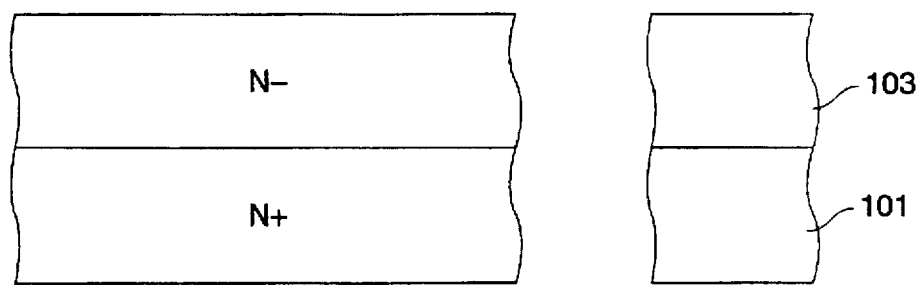
FIGS. 8–11 are fabrication methods of an IGBT according to the present invention.

FIG. 7 is a simplified circuit diagram 700 of an AC switch according to the present invention. The circuit diagram 700 includes IGBT T1 and IGBT T2. Each IGBT includes a source terminal S1, S2, a gate terminal G1, G2, and a drain terminal D1, D2. The source terminal S1 connects to the drain terminal D2 at a first node, and the source terminal S2 connects to the drain terminal D1 at a second node. The first node connects to an AC power source, and the second node connects to a load. The AC power source also connects to the load to complete the switch loop. AC power is applied to the load by way of selectively providing switching voltages to the transistor gates G1 and G2.

Switching voltages at the gate terminals turn-on each of the IGBT transistors at selected times to allow AC current to pass therethrough. For example, voltage applied to gate G2 passes positive current via positive alternation through transistor T2, and voltage applied to gate G1 passes negative current via negative alternation through transistor T1. By way of the present IGBT structure, each of the IGBT transistors may block voltage in forward and reverse blocking modes for application with the AC power source. The breakdown voltage of each transistor is, for example, 1,800 volts and greater. The breakdown voltage of each transistor may also be 300 volts and greater, 600 volts and greater, or 3,000 volts and greater. The AC power source can provide an AC voltage at about 300 volts and greater, or at about 600 volts and greater, or at about 1,800 volts and greater, or at about 3,000 volts and greater. Of course, the breakdown voltage of each IGBT device and the voltage produced by the AC power supply depend upon the particular application.

FIGS. 8–11 illustrate a simplified method of fabrication for the present high voltage IGBT device. The present fabrication method begins with an semiconductor substrate such as an N+ type substrate 101 and the like of FIG. 8. It should be noted that the present fabrication method relies upon an N+ type substrate, but may also use other types of substrates. The N+ type substrate includes an N− type layer 103 defined thereon by way of standard chemical vapor deposition (CVD) techniques and the like. The N− type layer includes an N type impurity such as phosphorous or the like at a concentration ranging from about $10^{13}$ atoms/cm$^3$ to about $10^{17}$ atoms/cm$^3$, and is preferably at about $4\times10^{13}$ atoms/cm$^3$ for preferred bipolar transistor operation. Relative to the N− type layer, the N+ type semiconductor substrate includes an N type impurity such as phosphorous or the like at a concentration ranging from about $10^{15}$ atoms/cm$^3$ to about $10^{19}$ atoms/cm$^3$, and is preferably at about $10^{17}$ atoms/cm$^3$. Of course, other concentrations may also be provided depending upon the particular application.

Figure 9:
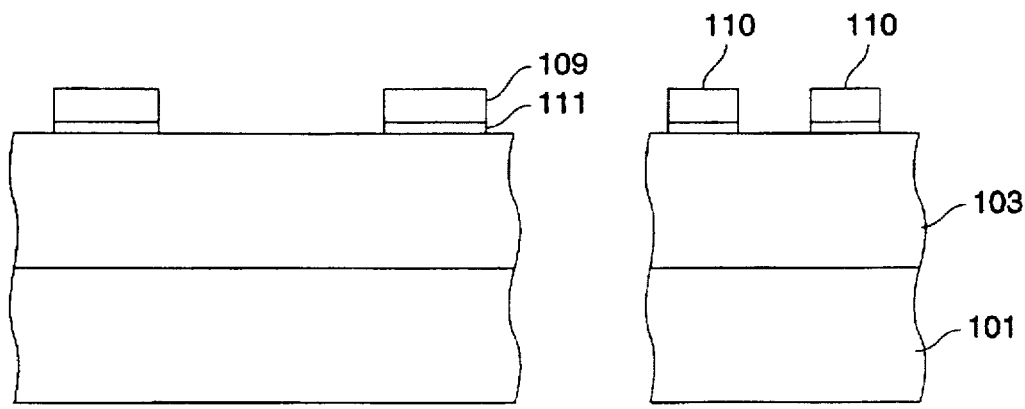

Active IGBT devices define onto the N− type layer by way of, for example, a double diffused MOS (DMOS) technique and others. The DMOS technique defines a gate electrode layer 109 overlying a thin layer of high quality oxide 111 as illustrated by FIG. 9. The gate electrode layer is typical made of polysilicon and the like, which is preferably doped with an N type dopant material for conductivity. Steps of masking and etching define the gate electrodes (G) overlying the thin high quality oxide formed over the N− type layer. Also shown are field plate layers formed overlying a portion of the N− type layer.

Figure 10:
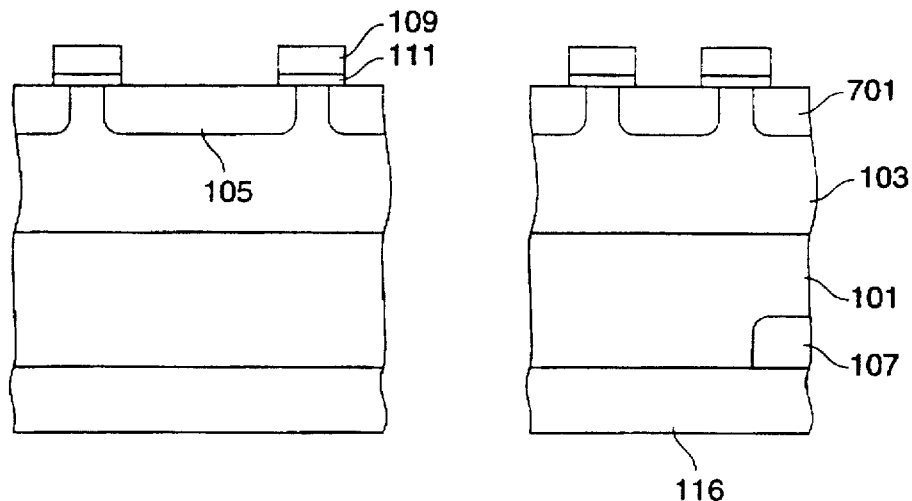
Figure 11:
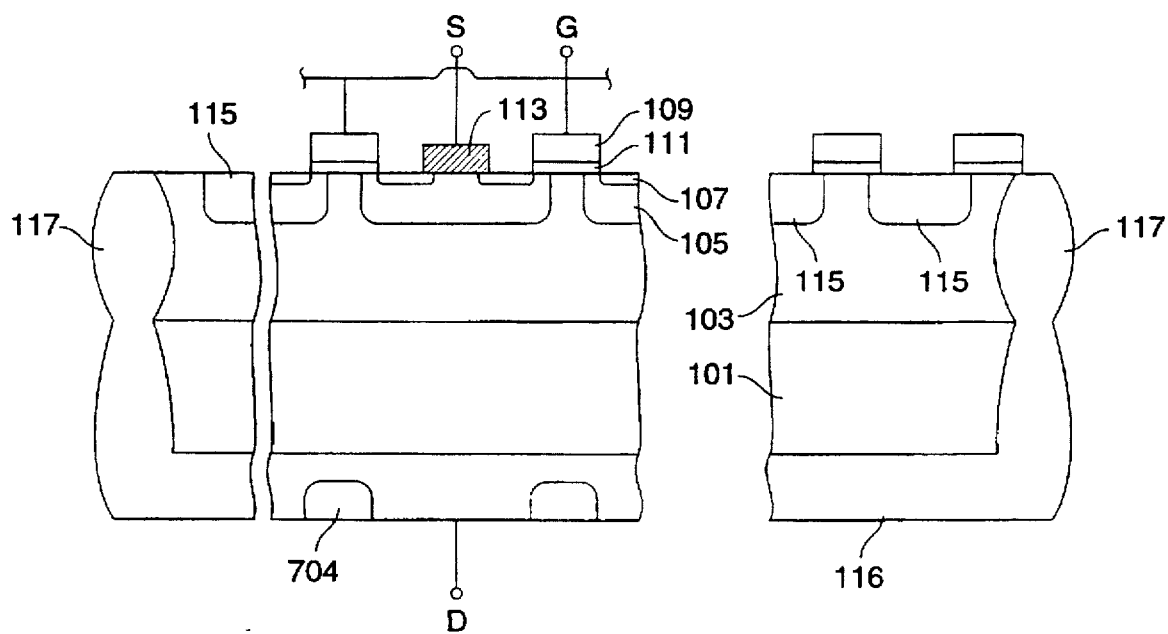

An implant step(s) forms P type well regions 105 in the N− type layer as illustrated by FIG. 10. Each P type well region is preferably a P/P+ type well or the like, and is defined between each of the gate electrodes. The P type well region includes a boron impurity concentration ranging from about $10^{14}$ atoms/cm$^3$ to about $10^{18}$ atoms/cm$^3$, and is preferably at about $10^{16}$ atoms/cm$^3$. The implant step also forms P type guard ring region(s) 115. The P type guard ring regions are defined at an outer periphery of the active cell region for the purpose of preventing the conductive region of forming outside the main junction region. Thus, the P type guard ring regions preserve the high voltage characteristics of the present IGBT device.

A P type region 116 defining a drain region (D) is formed overlying the backside of the N+ type semiconductor substrate in an implant step. The P type region includes a boron impurity concentration ranging from about $10^{15}$ atoms/cm$^3$ to about $10^{18}$ atoms/cm$^3$, and is preferably at about $10^{18}$ atoms/cm$^3$. A subsequent diffusion step creates the P type drain region which can range in depth from about 50 microns to about 300 microns, and is preferably at about 100 microns for a 600 volt to 3,000 volt IGBT device. The P type impurity for the P type well region, the P type guard ring region, and the P type drain region is preferably boron or the like.

A P type region 701 is also defined at the scribe line of the integrated circuit chip. A P type region 703 is also defined from the backside of the wafer. Both of the P type regions are defined by way of sputtering, implantation or the like using an impurity with a higher mobility than, for example, the P type well region, the P type guard ring region, and the P type drain region. By way of a subsequent diffusion step(s), the P type regions 701, 703 diffuse faster than the P type impurities of, for example, the well region, the guard ring region, and the drain region. The faster diffusion rate allows the P type regions to connect to each other 117. This forms a continuous P type "frame" (or diffusion region) around the periphery of the integrated circuit, thereby eliminating the N+/P+ junction region of the conventional IGBT device. The P type impurity with the higher mobility is preferably aluminum or the like. A step of selective sputtering coats selected regions of the integrated circuit with the aluminum for subsequent thermal diffusion or the like.

A source implant step forms an N type source region(s) 107 (S) within the periphery of the P type well region(s) 105. The source implant is preferably an arsenic implant where the arsenic is at a concentration ranging from about $10^{17}$ atoms/cm$^3$ to about $10^{20}$ atoms/cm$^3$, and is preferably at about $3\times10^{19}$ atoms/cm$^3$. A metallization layer typically aluminum or the like defines a source metallization layer. As shown, the source (S), the gate (G), and the drain (D) define the IGBT according to the present invention.

Optionally, an N+ type dopant 704 such as phosphorous or the like forms selected N+ type regions in the drain region. The N+ type regions modify the present IGBT device performance for special switching and forward voltage drop characteristics. The N+ type regions includes a phosphorous impurity at a concentration ranging from about $10^{16}$ atoms/cm$^3$ to about $10^{19}$ atoms/cm$^3$, and is preferably at about $7 \times 10^{18}$ atoms/cm$^3$.

While the above is a full description of the specific embodiments, various modifications, alternative constructions, and equivalents may be used. For example, while the description above is in terms of P type well region, it would be possible to implement the present invention with an N type well region, or the like. Furthermore, while the embodiments shown are generally in terms of an MOSFET, thyristor, and IGBT, it would be possible to implement the improved substrate in the present invention with any device such as, for example, an MCT, or the like.

Therefore, the above description and illustrations should not be taken as limiting the scope of the present invention which is defined by the appended claims.

What is claimed is:

1. A method for forming a high voltage insulated gate bipolar transistor, said method comprising:

providing a semiconductor layer of first conductivity type, said semiconductor layer including a front-side surface, a backside surface, and a scribe region, said semiconductor layer further including a plurality of active cells on said front-side surface;

forming a backside layer of second conductivity type from a first impurity that is opposite to said first conductivity type overlying said backside surface; and forming a continuous diffusion region from a second impurity of said second conductivity type through said semiconductor layer to connect said scribe region to said backside layer, said second impurity having a higher mobility than said first impurity;

wherein said high voltage integrated circuit device includes substantially the same forward blocking rating and reverse blocking rating.

2. The method of claim 1 wherein said semiconductor layer includes a semiconductor substrate and an overlying epitaxial layer.

3. The method of clam 1 wherein said high voltage integrated circuit device includes a forward blocking rating of more than 300 volts and a reverse blocking rating of more than 300 volts.

4. The method of claim 1 wherein each of said active cells includes a portion of an insulated gate bipolar transistor, said portion including a source region and a gate region.

5. The method of claim 1 wherein said backside layer defines a drain region.

6. The method of claim 1 wherein said backside layer includes a plurality of well regions of said first conductivity type.

7. The method of claim 1 wherein said continuous diffusion region of said second conductivity type comprises an aluminum element.

8. The method of claim 1 wherein said continuous diffusion region is formed by steps of sputtering aluminum overlying said scribe region and portions of said backside layer, and diffusing said aluminum from said scribe region and said portions to define said continuous diffusion region.

9. A method for forming a high voltage integrated circuit device, said method comprising:

providing a semiconductor layer of first conductivity type, said semiconductor layer including a front-side surface, a backside surface, and a scribe region, said semiconductor layer further including a plurality of active cells on said front-side surface;

forming a backside layer of second conductivity type that is opposite to said first conductivity type overlying said backside surface, said backside layer of second conductivity type being defined by a first impurity; and forming a continuous diffusion region of a second impurity of said second conductivity type through said semiconductor layer to connect said scribe region to said backside layer;

wherein said second impurity has a higher mobility than said first impurity and wherein said high voltage integrated circuit device includes substantially the same forward blocking rating and reverse blocking rating.

10. The method of claim 9 wherein said semiconductor layer includes a semiconductor substrate and an overly epitaxial layer.

11. The method of claim 9 wherein said high voltage integrated circuit device is an insulated gate bipolar transistor.

12. The method of claim 11 wherein said high voltage integrated circuit device includes a forward blocking rating of more than 300 volts and a reverse blocking rating of more than 300 volts.

13. The method of claim 9 wherein each of said active cells includes a portion of an insulated gate bipolar transistor, said portion including a source region and a gate region.

14. The method of claim 9 wherein said backside layer defines a drain region.

15. The method of claim 9 wherein said backside layer includes a plurality of well regions of said first conductivity type.

16. The method of claim 9 wherein said continuous diffusion region of said second conductivity type comprises an aluminum element.

17. The method of claim 9 wherein said continuous diffusion region is formed by steps of sputtering aluminum overlying said scribe region and portions of said backside layer, and diffusing said aluminum from said scribe region and said portions to define said continuous diffusion region.

18. A method for forming an insulated gate high voltage integrated circuit device, said method comprising:

providing a semiconductor layer of N conductivity type, said semiconductor layer including a front-side surface, a backside surface, and a scribe region, said semiconductor layer further including a plurality of active cells on said front-side surface;

forming a backside layer of P conductivity type from a first impurity that is opposite to said N conductivity type overlying said backside surface;

forming a P conductivity type region of a second impurity in said scribe region;

forming a P conductivity type region of said second impurity on a portion of said backside layer; and forming a continuous diffusion region by connecting through said semiconductor layer said P conductivity type region of said second impurity in said scribe region to said P conductivity type region of said second impurity on said portion of said backside layer;

wherein said second impurity has a higher mobility than said first impurity to define said continuous diffusion region during a diffusion process;

and wherein said high voltage integrated circuit device includes a forward blocking rating of more than 300 volts and a reverse blocking rating of more than 300 volts.

19. The method of claim 18 wherein said semiconductor layer includes a semiconductor substrate and an overlying epitaxial layer.

20. The method of claim 18 wherein said high voltage integrated circuit device includes substantially the same forward blocking rating and reverse blocking rating.

21. The method of claim 18 wherein each of said active cells includes a portion of an insulated gate bipolar transistor, said portion includes a source region and a gate region.

22. The method of claim 18 wherein said backside layer defines a drain region.

23. The method of claim 18 wherein said backside layer includes a plurality of well regions of said first conductivity type.

24. The method of claim 18 wherein said continuous diffusion region of said second conductivity type comprises an aluminum element.

25. The method of claim 18 wherein said continuous diffusion region forms a continuous frame around a periphery of said integrated circuit to eliminate an N/P junction region underlying said scribe region.

* * * * *